(12) United States Patent
Sawada et al.

(10) Patent No.: US 11,398,843 B2
(45) Date of Patent: Jul. 26, 2022

(54) RADIO FREQUENCY MODULE AND COMMUNICATION DEVICE

(71) Applicant: Murata Manufacturing Co., Ltd., Nagaokakyo (JP)

(72) Inventors: Yoichi Sawada, Nagaokakyo (JP); Yukiya Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/115,816

(22) Filed: Dec. 9, 2020

(65) Prior Publication Data

US 2021/0184704 A1 Jun. 17, 2021

(30) Foreign Application Priority Data

Dec. 17, 2019 (JP) .............................. JP2019-227443

(51) Int. Cl.
*H04B 1/00* (2006.01)
*H04B 1/04* (2006.01)

(52) U.S. Cl.
CPC ........... *H04B 1/006* (2013.01); *H04B 1/0458* (2013.01); *H04B 1/0475* (2013.01); *H04B 1/0483* (2013.01); *H04B 2001/0408* (2013.01)

(58) Field of Classification Search
CPC .... H04B 1/006; H04B 1/0458; H04B 1/0475; H04B 1/0483; H04B 2001/0408
USPC .................................. 375/219, 262, 267, 299
See application file for complete search history.

(56) References Cited

U.S. PATENT DOCUMENTS

| | | | | |
|---|---|---|---|---|
| 9,300,286 B2* | 3/2016 | Gaynor | ................ | H04B 1/0458 |
| 9,705,478 B2* | 7/2017 | Maxim | ..................... | H03J 3/06 |
| 10,153,803 B2* | 12/2018 | Sugawara | ................ | H04B 1/18 |
| 2005/0104685 A1* | 5/2005 | Kuroki | ..................... | H05K 1/16 |
| | | | | 333/133 |
| 2008/0212283 A1* | 9/2008 | Chernyakov | ....... | H01L 23/3677 |
| | | | | 361/709 |
| 2011/0260806 A1* | 10/2011 | Takeuchi | ............... | H03H 7/461 |
| | | | | 333/103 |
| 2013/0307639 A1* | 11/2013 | Mori | ........................ | H03H 9/54 |
| | | | | 333/133 |
| 2018/0233604 A1* | 8/2018 | Gu | ......................... | H01L 29/20 |
| 2019/0386397 A1* | 12/2019 | Son | ......................... | H01Q 5/10 |

(Continued)

FOREIGN PATENT DOCUMENTS

| JP | 2017-098630 A | 6/2017 |
|---|---|---|
| KR | 10-2019-0133605 A | 12/2019 |
| WO | 2018/168500 A1 | 9/2018 |

OTHER PUBLICATIONS

Korean Office Action dated Jan. 5, 2022, in corresponding Korean Patent Application No. 10-2020-0160660.

*Primary Examiner* — Emmanuel Bayard
(74) *Attorney, Agent, or Firm* — Xsensus LLP

(57) ABSTRACT

A radio frequency module includes: a module board including a first principal surface and a second principal surface on opposite sides of the module board; an antenna connection terminal; a filter that is on the first principal surface and connected to the antenna connection terminal, wherein the filter includes one or more inductors and one or more capacitors, and is configured to allow a transmission signal and a reception signal to pass through; and a reception low noise amplifier on the second principal surface and configured to amplify the reception signal.

20 Claims, 6 Drawing Sheets

(56) References Cited

U.S. PATENT DOCUMENTS

2020/0076405 A1\* 3/2020 Liu ...................... H03H 9/0523
2021/0143795 A1\* 5/2021 Azizi ...................... H03F 3/195

\* cited by examiner

RADIO FREQUENCY MODULE AND COMMUNICATION DEVICE

CROSS REFERENCE TO RELATED APPLICATION

The present application is based on and claims priority to Japanese Patent Application No. 2019-227443 filed on Dec. 17, 2019. The entire disclosure of the above-identified application, including the specification, drawings and claims is incorporated herein by reference in its entirety.

TECHNICAL FIELD

The present disclosure relates to a radio frequency (RF) module and a communication device.

BACKGROUND

In mobile communication apparatuses such as mobile phones, the arrangement of circuit elements included in radio frequency front-end circuits is becoming complex, particularly with developments in multiband technologies.

Japanese Unexamined Patent Application Publication No. 2017-98630 discloses a front-end module including: a plurality of transmission and reception paths for transmitting and receiving radio frequency signals of predetermined communication bands (frequency bands); an input switch to which the plurality of transmission and reception paths are connected; and an antenna matching circuit connected between the input switch and an antenna connection terminal. The antenna matching circuit is an inductor-capacitor (LC) filter that includes at least one of an inductor or a capacitor and has a filtering function. The front-end module reduces deterioration of isolation between the input and the output by optimizing the arrangement, in the peripheral portion of a switch integrated circuit (IC), of filters including the above LC filter and matching circuits including the above antenna matching circuit that are disposed on the transmission and reception paths.

SUMMARY

Technical Problems

However, as recognized by the present inventor, when the front-end module disclosed in Japanese Unexamined Patent Application Publication No. 2017-98630 is realized as a small-sized radio frequency module, electromagnetic coupling may occur between a reception low noise amplifier disposed on the reception paths or a switch connected to the input terminal of the reception low noise amplifier and the inductor or capacitor of the LC filter. In that case, for example, a harmonic of a high-output transmission signal transferred via a transmission path or spurious waves of intermodulation distortion between the transmission signal and another radio frequency signal may flow into a reception path via the electromagnetic coupling, and cause deterioration of reception sensitivity of that reception path. In other words, isolation between transmission signals and reception signals deteriorates due to electromagnetic coupling between the reception low noise amplifier or the switch and the inductor or capacitor of the LC filter.

In view of the above circumstances, the present disclosure provides a radio frequency module and a communication device that reduce deterioration of isolation between transmission signals and reception signals.

Solutions

A radio frequency module according to an aspect of the present disclosure is a radio frequency module including: a module board including a first principal surface and a second principal surface on opposite sides of the module board; an antenna connection terminal; an inductor-capacitor (LC) filter that is connected to the antenna connection terminal, includes one or more inductors and one or more capacitors, and is configured to allow a transmission signal and a reception signal to pass through; and a reception low noise amplifier configured to amplify the reception signal. In this radio frequency module, the LC filter is on the first principal surface, and the reception low noise amplifier is on the second principal surface.

Further, a radio frequency module according to an aspect of the present disclosure is a radio frequency module including: a module board including a first principal surface and a second principal surface on opposite sides of the module board; an antenna connection terminal; an inductor-capacitor (LC) filter that is connected to the antenna connection terminal, includes one or more inductors and one or more capacitors, and is configured to allow a transmission signal and a reception signal of a first communication band and a transmission signal and a reception signal of a second communication band to pass through; a reception low noise amplifier configured to amplify the reception signal of the first communication band and the reception signal of the second communication band; a first reception filter that is on a reception path connecting the LC filter and the reception low noise amplifier, and is configured to allow the reception signal of the first communication band to pass through; a second reception filter that is on a reception path connecting the LC filter and the reception low noise amplifier, and is configured to allow the reception signal of the second communication band to pass through; and a switch configured to switch connection and disconnection between the first reception filter and the reception low noise amplifier, and switch connection and disconnection between the second reception filter and the reception low noise amplifier. In this radio frequency module, the LC filter is on the first principal surface, and the switch is on the second principal surface.

Advantageous Effects

According to the present disclosure, it is possible to provide a radio frequency module and a communication device that reduce deterioration of isolation between transmission signals and reception signals.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT

Figure 1:
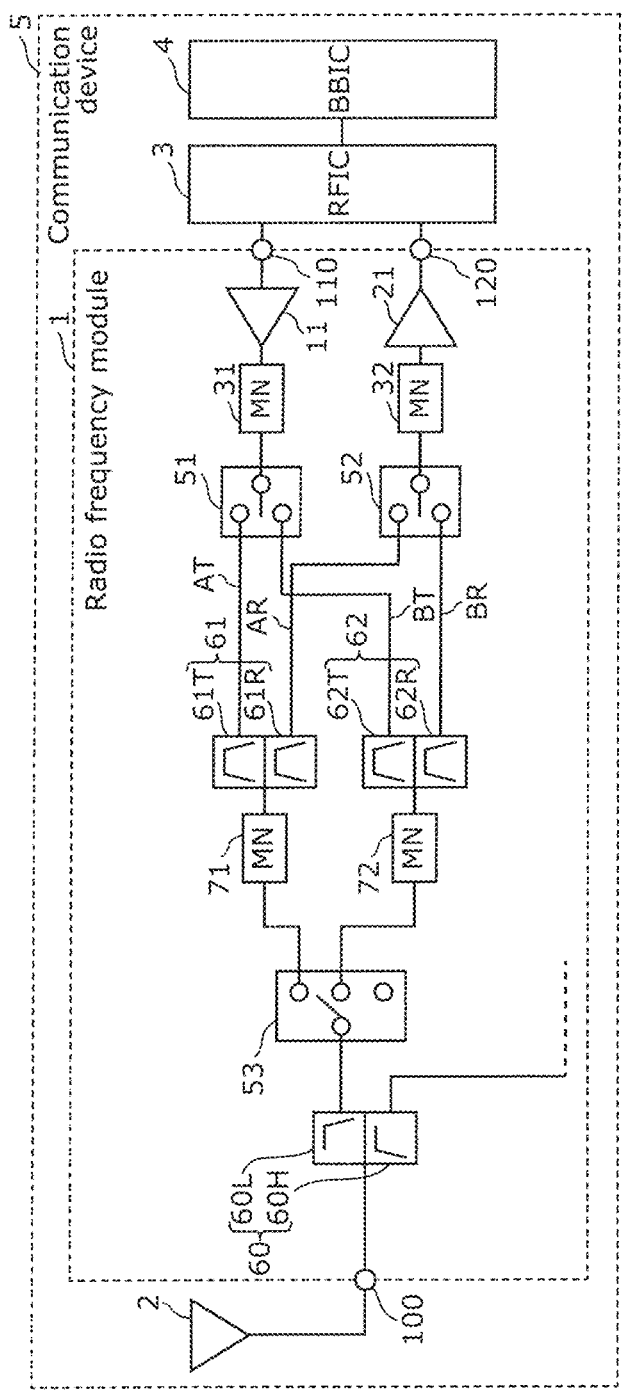
FIG. 1 illustrates a circuit configuration of a radio frequency module according to an embodiment.

Hereinafter, embodiments of the present disclosure will be described in detail. Note that the embodiments described below illustrate general or specific examples. The numerical values, shapes, materials, constituent elements, the arrangement and connection of the constituent elements, etc., illustrated in the following embodiments, working examples, and variations are mere examples, and are therefore not intended to limit the present disclosure. Among the constituent elements in the following working examples and variations, constituent elements not recited in the independent claims will be described as optional constituent elements. In addition, the sizes of the constituent elements and the ratios of the sizes illustrated in the drawings are not necessarily precise. In the drawings, essentially the same constituent elements share the same reference signs, and redundant descriptions will be omitted or simplified.

In the following description, value ranges, terms indicating relationships between elements such as "parallel" and "vertical", and terms indicating the shapes of elements such as "quadrilateral" do not have the meanings in the strict sense only, but include essentially equivalent value ranges and meanings, for example deviations of about a few percent.

Additionally, in the following description, when A, B, and C are mounted on a board, and C is disposed between A and B in a plan view of the board (or in a plan view of a principal surface of the board), it means that a straight line connecting a given point in A and a given point in B passes through the region of C in the plan view of the board. Furthermore, a plan view of the board is a view of the board and circuit elements mounted on the board obtained by orthographic projection on a plane parallel to the board.

In the following description, a "transmission path" refers to a transfer path including, for example, a line for propagating radio frequency transmission signals, an electrode directly connected to the line, and a terminal directly connected to the line or the electrode. A "reception path" refers to a transfer path including, for example, a line for propagating radio frequency reception signals, an electrode directly connected to the line, and a terminal directly connected to the line or the electrode.

In addition, in the following description, the expression "A and B are connected" applies not only when A and B are physically connected, but also when A and B are electrically connected.

EMBODIMENT

1. Circuit Configuration of Radio Frequency Module 1 and Communication Device 5

FIG. 1 illustrates a circuit configuration of radio frequency module 1 according to an embodiment. As illustrated in the figure, communication device 5 includes radio frequency module 1, antenna 2, radio frequency (RF) signal processing circuit (RF integrated circuit (IC)) 3, and baseband signal processing circuit (BBIC) 4.

RFIC 3 is an RF signal processing circuit that processes a radio frequency signal which is to be transmitted by antenna 2 and a radio frequency signal which has been received by antenna 2. Specifically, RFIC 3 processes reception signals input via reception paths of radio frequency module 1 by down-conversion, for example, and outputs resultant reception signals to BBIC 4. RFIC 3 also outputs, to transmission paths of radio frequency module 1, radio frequency transmission signals processed based on a signal input from BBIC 4.

BBIC 4 is a circuit that performs data processing using a signal of a frequency lower than that of a radio frequency signal transferred by radio frequency module 1. The signal processed by BBIC 4 is used as, for example, an image signal for image display, or an audio signal for reproduction by a loudspeaker.

RFIC 3 functions as a controller that controls connections of switches 51, 52, and 53 included in radio frequency module 1 based on communication bands (frequency bands) used. Specifically, RFIC 3 switches the connections of switches 51 to 53 included in radio frequency module 1 according to control signals (not illustrated). Note that the controller may be provided outside RFIC 3; for example in radio frequency module 1 or BBIC 4.

Antenna 2 is connected to antenna connection terminal 100 of radio frequency module 1, radiates a radio frequency signal output from radio frequency module 1, receives a radio frequency signal from outside, and outputs the received radio frequency signal to radio frequency module 1.

Note that in communication device 5 according to the present embodiment, antenna 2 and BBIC 4 are optional elements.

Next, a detailed configuration of radio frequency module 1 will be described.

As illustrated in FIG. 1, radio frequency module 1 includes antenna connection terminal 100, transmission power amplifier 11, reception low noise amplifier 21, transmission filters 61T and 62T, reception filters 61R and 62R, matching circuits 31, 32, 71, and 72, switches 51, 52, and 53, and diplexer 60.

Antenna connection terminal 100 is connected to antenna 2.

Transmission power amplifier 11 is an amplifier that amplifies transmission signals of communication band A (a first communication band) and communication band B (a second communication band) which belong to a first frequency band group. The radio frequency signals of communication bands A and B are input via transmission input terminal 110.

Reception low noise amplifier 21 is an amplifier that amplifies reception signals of communication bands A and B with low noise, and outputs the amplified signals to reception output terminal 120.

Diplexer 60 is an example of a multiplexer, and includes filter 60L and filter 60H. Filter 60L is an example of an inductor-capacitor (LC) filter. Filter 60L is a low-pass filter that is connected to antenna connection terminal 100, includes one or more inductors and one or more capacitors, and allows transmission signals and reception signals of the first frequency band group to pass through. Filter 60H is an example of a first filter. Filter 60H is a high-pass filter that is connected to antenna connection terminal 100 and has a frequency range of a second frequency band group different from the first frequency band group as the passband. Note that diplexer 60 may further include a filter having a frequency range of a frequency band group different from the first frequency band group and the second frequency band group as the passband.

One terminal of filter 60L and one terminal of filter 60H are connected commonly to antenna connection terminal 100. Note that filter 60H may be a low-pass filter and filter 60L may be a bandpass filter or a high-pass filter when the first frequency band group is higher in frequency than the second frequency band group.

Note that filter 60L may include at least one of a chip inductor or a chip capacitor.

Transmission path AT is for transferring transmission signals of communication band A. One end of transmission path AT is connected to antenna connection terminal 100, and the other end of transmission path AT is connected to transmission input terminal 110. Transmission path BT is for transferring transmission signals of communication band B. One end of transmission path BT is connected to antenna connection terminal 100, and the other end of transmission path BT is connected to transmission input terminal 110.

Reception path AR is for transferring reception signals of communication band A. One end of reception path AR is connected to antenna connection terminal 100, and the other end of reception path AR is connected to reception output terminal 120. Reception path BR is for transferring reception signals of communication band B. One end of reception path BR is connected to antenna connection terminal 100, and the other end of reception path BR is connected to reception output terminal 120.

Transmission filter 61T is disposed on transmission path AT. Among the transmission signals amplified by transmission power amplifier 11, transmission filter 61T allows transmission signals of communication band A to pass through. Transmission filter 62T is disposed on transmission path BT. Among the transmission signals amplified by transmission power amplifier 11, transmission filter 62T allows transmission signals of communication band B to pass through.

Reception filter 61R is an example of a first reception filter, and is disposed on reception path AR between filter 60L and reception low noise amplifier 21. Among the reception signals input via antenna connection terminal 100, reception filter 61R allows reception signals of communication band A to pass through. Reception filter 62R is an example of a second reception filter, and is disposed on reception path BR between filter 60L and reception low noise amplifier 21. Among the reception signals input via antenna connection terminal 100, reception filter 62R allows reception signals of communication band B to pass through.

Transmission filter 61T and reception filter 61R constitute duplexer 61 having communication band A as the passband. Transmission filter 62T and reception filter 62R constitute duplexer 62 having communication band B as the passband.

Matching circuit 31 is disposed on transmission paths AT and BT connecting transmission power amplifier 11 and transmission filters 61T and 62T, respectively, and matches the impedance of transmission power amplifier 11 with the impedances of transmission filters 611 and 62T.

Matching circuit 32 is disposed on reception paths AR and BR connecting reception low noise amplifier 21 and reception filters 61R and 62R, respectively, and matches the impedance of reception low noise amplifier 21 with the impedances of reception filters 61R and 62R.

Switch 51 includes a common terminal and two selection terminals. The common terminal of switch 51 is connected to the output terminal of transmission power amplifier 11 via matching circuit 31. One of the selection terminals of switch 51 is connected to transmission filter 61T disposed on transmission path AT, and the other selection terminal of switch 51 is connected to transmission filter 62T disposed on transmission path BT. In this connection configuration, switch 51 switches between connection of the common terminal to one selection terminal and connection of the common terminal to the other selection terminal. In other words, switch 51 switches connection and disconnection between transmission power amplifier 11 and transmission path AT, and also switches connection and disconnection between transmission power amplifier 11 and transmission path BT. Switch 51 is a single pole double throw (SPDT) switch circuit, for example.

Switch 52 includes a common terminal and two selection terminals. The common terminal of switch 52 is connected to the input terminal of reception low noise amplifier 21 via matching circuit 32. One of the selection terminals of switch 52 is connected to reception filter 61R disposed on reception path AR, and the other selection terminal of switch 52 is connected to reception filter 62R disposed on reception path BR. In this connection configuration, switch 52 switches between connection of the common terminal to one selection terminal and connection of the common terminal to the other selection terminal. In other words, switch 52 switches connection and disconnection between reception low noise amplifier 21 and reception filter 61R, and also switches connection and disconnection between reception low noise amplifier 21 and reception filter 62R. Switch 52 is an SPDT switch circuit, for example.

Switch 53 is an example of an antenna switch. Switch 53 is connected to antenna connection terminal 100 via diplexer 60, and switches between (1) connection of antenna connection terminal 100 to transmission path AT and reception path AR and (2) connection of antenna connection terminal 100 to transmission path BT and reception path BR. Note that switch 53 is a multiple-connection switch circuit capable of simultaneously establishing the above connections (1) and (2).

Matching circuit 71 is disposed on a path connecting switch 53 and duplexer 61, and matches the impedances of antenna 2 and switch 53 with the impedance of duplexer 61. Matching circuit 72 is disposed on a path connecting switch 53 and duplexer 62, and matches the impedances of antenna 2 and switch 53 with the impedance of duplexer 62.

Note that transmission filters 61T and 62T, reception filters 61R and 62R, and filter 60H may each be, but are not limited to, any of an acoustic wave filter that uses surface acoustic waves (SAWs), an acoustic wave filter that uses bulk acoustic waves (BAWs), an LC resonance filter, and a dielectric filter, for example.

Transmission power amplifier 11 and reception low noise amplifier 21 are each configured with, for example, a field-effect transistor (FET) or a hetero-junction bipolar transistor (HBT) including, for instance, a Si-based complementary metal oxide semiconductor (CMOS) or GaAs.

Reception low noise amplifier 21 and switches 52 and 53 may be formed in a semiconductor integrated circuit (IC). The semiconductor IC may further include transmission power amplifier 11 and switch 51. The semiconductor IC includes a CMOS, for example, and is specifically formed by the silicon on insulator (SOI) process. Accordingly, the semiconductor IC can be manufactured at low cost. Note that the semiconductor IC may include at least one of GaAs, SiGe, or GaN. Accordingly, a radio frequency signal having high-quality amplification properties and noise properties can be output.

Note that matching circuits 31, 32, 71, and 72 are optional elements of the radio frequency module according to the present disclosure.

In the configuration of radio frequency module 1, transmission power amplifier 11, matching circuit 31, switch 51, transmission filter 61T, matching circuit 71, switch 52, and filter 60L are included in a first transmitter circuit that transfers transmission signals of communication band A to antenna connection terminal 100. Filter 60L, switch 53, matching circuit 71, reception filter 61R, switch 52, matching circuit 32, and reception low noise amplifier 21 are included in a first receiver circuit that transfers reception signals of communication band A from antenna 2 via antenna connection terminal 100.

Transmission power amplifier 11, matching circuit 31, switch 51, transmission filter 62T, matching circuit 72, switch 53, and filter 60L are included in a second transmitter circuit that transfers transmission signals of communication band B to antenna connection terminal 100. Filter 60L, switch 53, matching circuit 72, reception filter 62R, switch 52, matching circuit 32, and reception low noise amplifier 21 are included in a second receiver circuit that transfers reception signals of communication band B from antenna 2 via antenna connection terminal 100.

With the above circuit configuration, radio frequency module 1 can perform at least one of transmission, reception, or transfer of radio frequency signals of communication band A and communication band B.

Note that in the radio frequency module according to the present disclosure, the above two transmitter circuits and two receiver circuits need not be connected to antenna connection terminal 100 via switch 53, and may be connected to antenna 2 via different terminals. In addition, it is sufficient so long as the radio frequency module according to the present disclosure includes at least filter 60L, transmission power amplifier 11, and reception low noise amplifier 21.

Here, in the case of mounting each circuit element included in radio frequency module 1 on a single module board as a small-sized front-end circuit, it is necessary to reduce the layout area of circuit components on the module board surface. In such a case, electromagnetic coupling may occur between reception low noise amplifier 21 disposed on the reception paths or switch 52 connected to the input terminal of reception low noise amplifier 21 and an inductor or a capacitor of filter 60L. In that case, for example, a harmonic of a high-output transmission signal transferred via a transmission path or spurious waves of intermodulation distortion between the transmission signal and another radio frequency signal may flow into a reception path via the electromagnetic coupling, and cause deterioration of reception sensitivity of that reception path. In other words, there arises a problem that isolation between transmission signals and reception signals deteriorates due to electromagnetic coupling between reception low noise amplifier 21 or switch 52 and an inductor or capacitor of filter 60L.

To address this, radio frequency module 1 according to the present embodiment has a configuration that reduces electromagnetic coupling between reception low noise amplifier 21 or switch 52 and filter 60L. The following describes a configuration of radio frequency module 1 according to the present embodiment that reduces the electromagnetic coupling.

2. Arrangement of Circuit Elements of Radio Frequency Module 1A According to Working Example 1

Figure 2A:
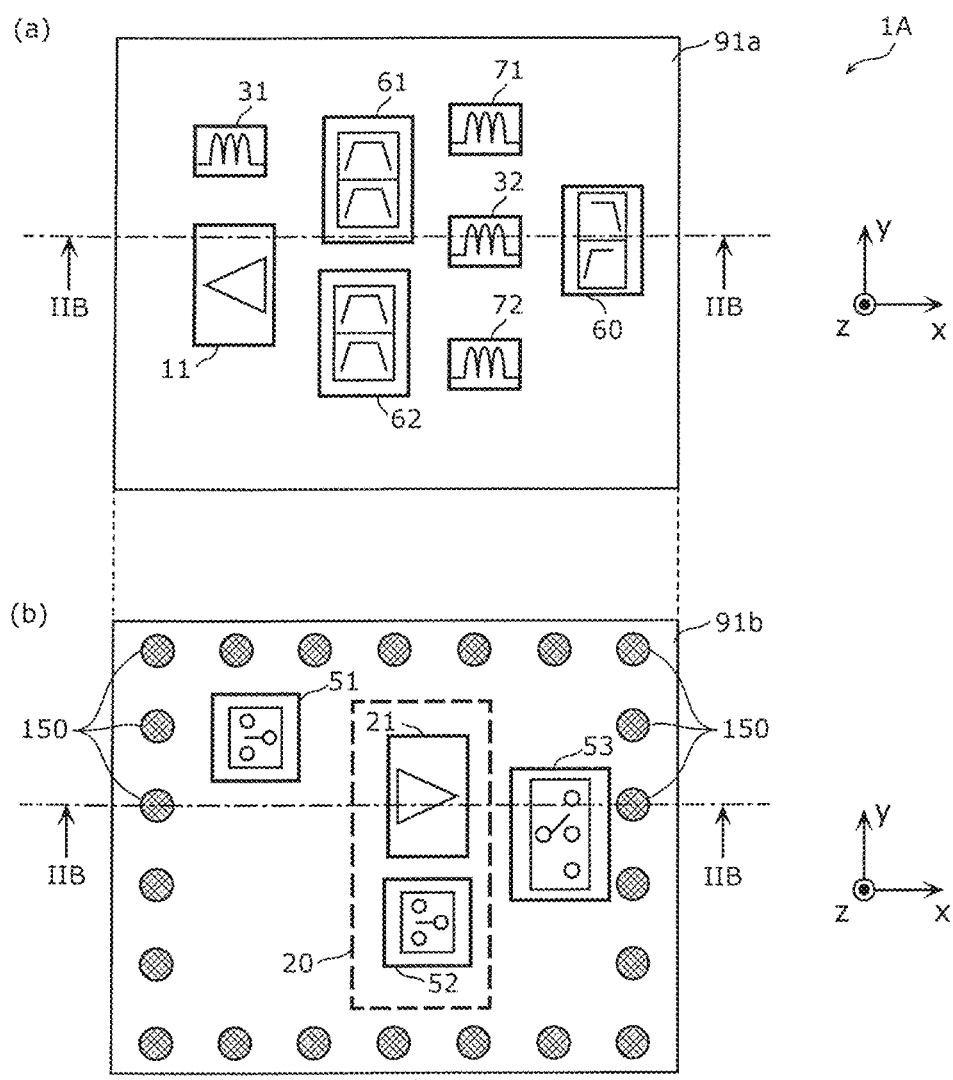
FIG. 2A is a schematic diagram illustrating a plan view configuration of a radio frequency module according to Working Example 1.
Figure 2B:
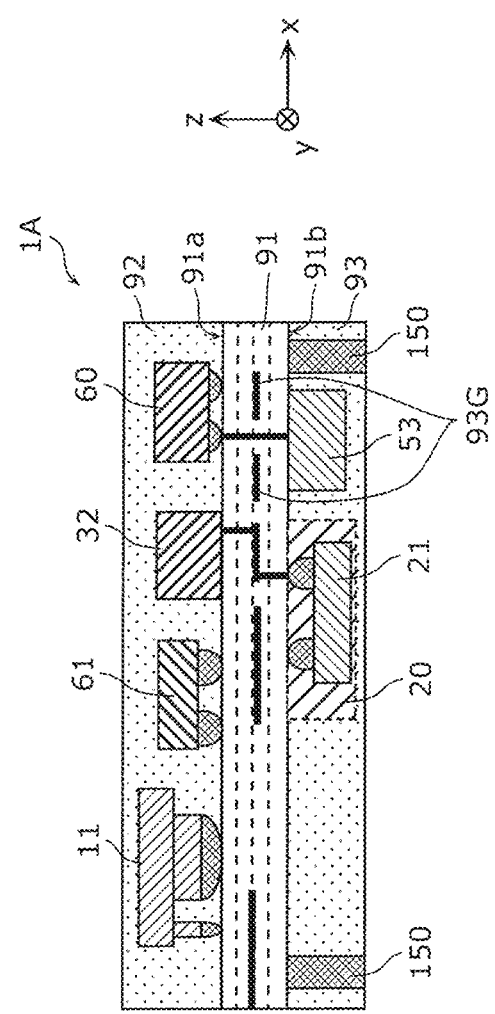
FIG. 2B is a schematic diagram illustrating a cross-sectional configuration of the radio frequency module according to Working Example 1.

FIG. 2A is a schematic diagram illustrating a plan view configuration of radio frequency module 1A according to Working Example 1. FIG. 2B is a schematic diagram illustrating a cross-sectional configuration of radio frequency module 1A according to Working Example 1, and is specifically a cross-sectional view taken at line IIB-IIB in FIG. 2A. Note that part (a) of FIG. 2A illustrates how circuit elements are arranged when, of principal surfaces 91a and 91b located on opposite sides of module board 91, principal surface 91a is viewed from the z-axis positive side. Part (b) of FIG. 2A is a perspective view illustrating how circuit elements are arranged when principal surface 91b is viewed from the z-axis positive side.

Radio frequency module 1A according to Working Example 1 is to specifically show an arrangement of circuit elements included in radio frequency module 1 according to the embodiment.

As illustrated in FIG. 2A and FIG. 2B, radio frequency module 1A according to the present working example includes module board 91, resin components 92 and 93, and external-connection terminals 150 in addition to the circuit elements illustrated in FIG. 1.

Module board 91 includes principal surface 91a (a first principal surface) and principal surface 91b (a second principal surface) on opposite sides of module board 91, and is a board on which the above-described transmitter circuits and receiver circuits are mounted. Examples of the board used for module board 91 include a low temperature co-fired ceramics (LTCC) board having a configuration in which a plurality of dielectric layers are laminated, a high temperature co-fired ceramics (HTCC) board, a component-embedded board, a board having a redistribution layer (RDL), and a printed circuit board.

Resin component 92 is disposed on principal surface 91a of module board 91, and covers part of the transmitter circuits, part of the receiver circuits, and principal surface 91a of module board 91. Resin component 92 has a function to ensure the reliability of circuit elements included in the transmitter circuits and receiver circuits, such as the mechanical strength and moisture resistance. Resin component 93 is disposed on principal surface 91b of module board 91, and covers part of the transmitter circuits, part of the receiver circuits, and principal surface 91b of module board 91. Resin component 93 has a function to ensure the reliability of circuit elements included in the transmitter circuits and receiver circuits, such as the mechanical strength and moisture resistance. Note that resin components 92 and 93 are optional elements of the radio frequency module according to the present disclosure.

Each of matching circuits 31, 32, 71, and 72 includes at least one of an inductor or a capacitor.

As illustrated in FIG. 2A and FIG. 2B, in radio frequency module 1A according to the present working example, transmission power amplifier 11, duplexers 61 and 62, matching circuits 31, 32, 71, and 72, and diplexer 60 are disposed on principal surface 91a (the first principal surface) of module board 91. Reception low noise amplifier 21 and switches 51, 52, and 53 are disposed on principal surface 91b (the second principal surface) of module board 91. Note that matching circuits 31, 32, 71, and 72 may be embedded in module board 91.

In the present working example, filter 60L as mounted on principal surface 91a (the first principal surface). Reception low noise amplifier 21 is mounted on principal surface 91b (the second principal surface). That is to say, filter 60L and reception low noise amplifier 21 are disposed with module board 91 interposed therebetween. Thus, with the electromagnetic-field shielding function of module board 91, it is possible to reduce electromagnetic coupling between reception low noise amplifier 21 disposed on the reception paths and an inductor or capacitor of filter 60L. Accordingly, it is possible to, for example, reduce deterioration of reception sensitivity of a reception path caused by a flow of a harmonic of a high-output transmission signal output from transmission power amplifier 11 or spurious waves of intermodulation distortion between the transmission signal and another radio frequency signal into the reception path via the electromagnetic coupling (that is, without passing through reception filter 61R or 62R). In other words, by reducing the electromagnetic coupling between reception low noise amplifier 21 and an inductor or capacitor of filter 60L, it is possible to reduce deterioration of isolation between transmission signals and reception signals.

Note that in the present working example, filter 60L includes at least one of a chip inductor or a chip capacitor, and is surface-mounted on principal surface 91a. The inductor included in filter 60L may be a planar coil pattern formed on principal surface 91a of module board 91. Even in such a case, since filter 60L and reception low noise amplifier 21 are disposed with module board 91 interposed therebetween, the electromagnetic coupling between (i) the planar coil pattern of filter 60L and (ii) the circuit elements and circuit lines included in reception low noise amplifier 21 is reduced, thus enabling reduction of deterioration of isolation between transmission signals and reception signals.

Note that as illustrated in FIG. 2B, module board 91 desirably includes ground planar electrode 93G between principal surface 91a and principal surface 91b. More specifically, it is desirable that module board 91 have a multilayer structure in which a plurality of dielectric layers are laminated, and that at least one of the dielectric layers have ground planar electrode 93G formed therein. Here, it is desirable that, in a plan view of module board 91, a footprint of ground planar electrode 93G at least partially overlaps with a footprint of filter 60L (diplexer 60) and at least partially overlaps with a footprint of reception low noise amplifier 21.

According to this configuration, with the electromagnetic-field shielding function of ground planar electrode 93G, the isolation between filter 60L and reception low noise amplifier 21 is further improved. Therefore, deterioration of isolation between transmission signals and reception signals can be further reduced.

In radio frequency module 1A according to the present working example, a plurality of external-connection terminals 150 are disposed on principal surface 91b (the second principal surface) of module board 91. Radio frequency module 1A transmits and receives, via the plurality of external-connection terminals 150, electric signals to and from a motherboard that is disposed on the z-axis negative side of radio frequency module 1A. As illustrated in part (b) of FIG. 2A, the plurality of external-connection terminals 150 may be disposed in the edge region of principal surface 91b. Some of external-connection terminals 150 are set to the ground potential of the motherboard.

With the above arrangement of external-connection terminals 150, since a plurality of external-connection terminals 150 used as ground electrodes are disposed around reception low noise amplifier 21, it is possible to inhibit exogenous noise from flowing into the receiver circuits.

In radio frequency module 1A according to the present working example, transmission power amplifier 11 is mounted on principal surface 91a (the first principal surface).

Among the circuit components included in radio frequency module 1A, transmission power amplifier 11 is a component that generates a large amount of heat. To enhance the heat dissipation of radio frequency module 1A, it is important to dissipate heat generated by transmission power amplifier 11 to the motherboard via a heat dissipation path having low thermal resistance. If transmission power amplifier 11 is mounted on principal surface 91b, an electrode line connected to transmission power amplifier 11 is disposed on principal surface 91b. Thus, the heat dissipation path in such a case includes a heat dissipation path passing only through a planar line pattern provided on principal surface 91b (along the xy plane direction). Since this planar line pattern is formed with a thin metal film, the thermal resistance is high. Consequently, the heat dissipation deteriorates if transmission power amplifier 11 is disposed on principal surface 91b.

In contrast, when transmission power amplifier 11 is mounted on principal surface 91a, transmission power amplifier 11 and external-connection terminal 150 can be connected via a penetrating electrode that penetrates through module board 91 between principal surfaces 91a and 91b. Thus, the heat dissipation path of transmission power amplifier 11 can be other than a heat dissipation path that passes only through, among the lines provided in module board 91, a planar line pattern with high thermal resistance provided along the xy plane direction. Accordingly, it is possible to provide small-sized radio frequency module 1A having enhanced heat dissipation from transmission power amplifier 11 to the motherboard.

Note that from the viewpoint of heat dissipation, the above-described penetrating electrode or a heat dissipating component is desirably disposed in a region of principal surface 91b facing the region of principal surface 91a in which transmission power amplifier 11 is disposed. Thus, no circuit elements are desirably disposed in that region of principal surface 91b as illustrated in part (b) of FIG. 2A.

In the present working example, filter 60L is mounted on principal surface 91a (the first principal surface). Switch 52 is mounted on principal surface 91b (the second principal surface). That is to say, filter 60L and switch 52 are disposed with module board 91 interposed therebetween. Thus, with the electromagnetic-field shielding function of module board 91, it is possible to reduce electromagnetic coupling between switch 52 connected to the input terminal of reception low noise amplifier 21 and an inductor or capacitor of filter 60L. Accordingly, it is possible to, for example, reduce deterioration of reception sensitivity of a reception path caused by a flow of a harmonic of a high-output transmission signal output from transmission power amplifier 11 or spurious waves of intermodulation distortion between the transmission signal and another radio frequency signal into the reception path via the electromagnetic coupling (that is, without passing through reception filter 61R or 62R). In other words, by reducing the electromagnetic coupling between switch 52 and an inductor or capacitor of filter 60L, it is possible to reduce deterioration of isolation between transmission signals and reception signals.

Note that in radio frequency module 1A according to the present working example, it is sufficient so long as filter 60L and reception low noise amplifier 21 are separately disposed on principal surfaces 91a and 91b of module board 91. The other circuit components may be disposed on any of principal surfaces 91a and 91b, or may be embedded in module board 91. Alternatively, in radio frequency module 1A according to the present working example, it is sufficient so long as filter 60L and switch 52 are separately disposed on principal surfaces 91a and 91b of module board 91. The other circuit components may be disposed on any of principal surfaces 91a and 91b, or may be embedded in module board 91.

In radio frequency module 1A according to the present working example, of principal surfaces 91a and 91b, transmission power amplifier 11 that cannot be readily reduced in profile is not disposed on principal surface 91b facing the motherboard, but reception low noise amplifier 21 and switches 51, 52, and 53 that can be readily reduced in profile are disposed on principal surface 91b, thus enabling profile reduction of radio frequency module 1A as a whole.

As illustrated in FIG. 2A and FIG. 2B, reception low noise amplifier 21 and switch 52 may be embedded in single semiconductor IC 20. This makes it possible to reduce the height in the z-axis direction on the principal surface 91b side, and reduce the component mounting area of principal surface 91b. Thus, the size of radio frequency module 1A can be reduced. Semiconductor IC 20 may further include switch 53, and may further include switch 51.

Figure 2C:
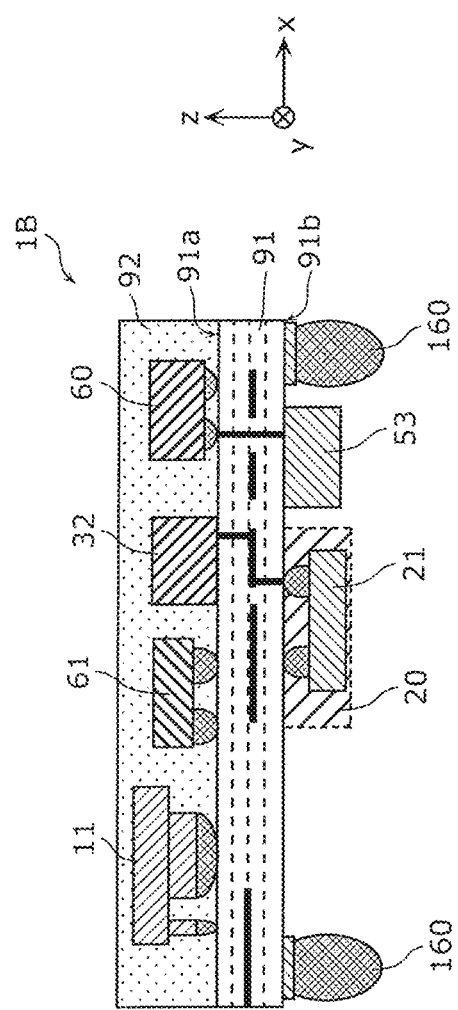
FIG. 2C is a schematic diagram illustrating a cross-sectional configuration of a radio frequency module according to a variation.

Note that external-connection terminals 150 may be columnar electrodes penetrating through resin component 93 in the z-axis direction as illustrated in FIG. 2A and FIG. 2B, or may be bump electrodes 160 formed on principal surface 91b as illustrated in FIG. 2C. As illustrated in FIG. 2C, resin component 93 is not disposed on principal surface 91b when external-connection terminals 150 are bump electrodes 160.

In radio frequency module 1A according to the present working example, external-connection terminals 150 may be disposed on principal surface 91a.

3. Arrangement of Circuit Elements of Radio Frequency Module 1C According to Working Example 2

Figure 3A:
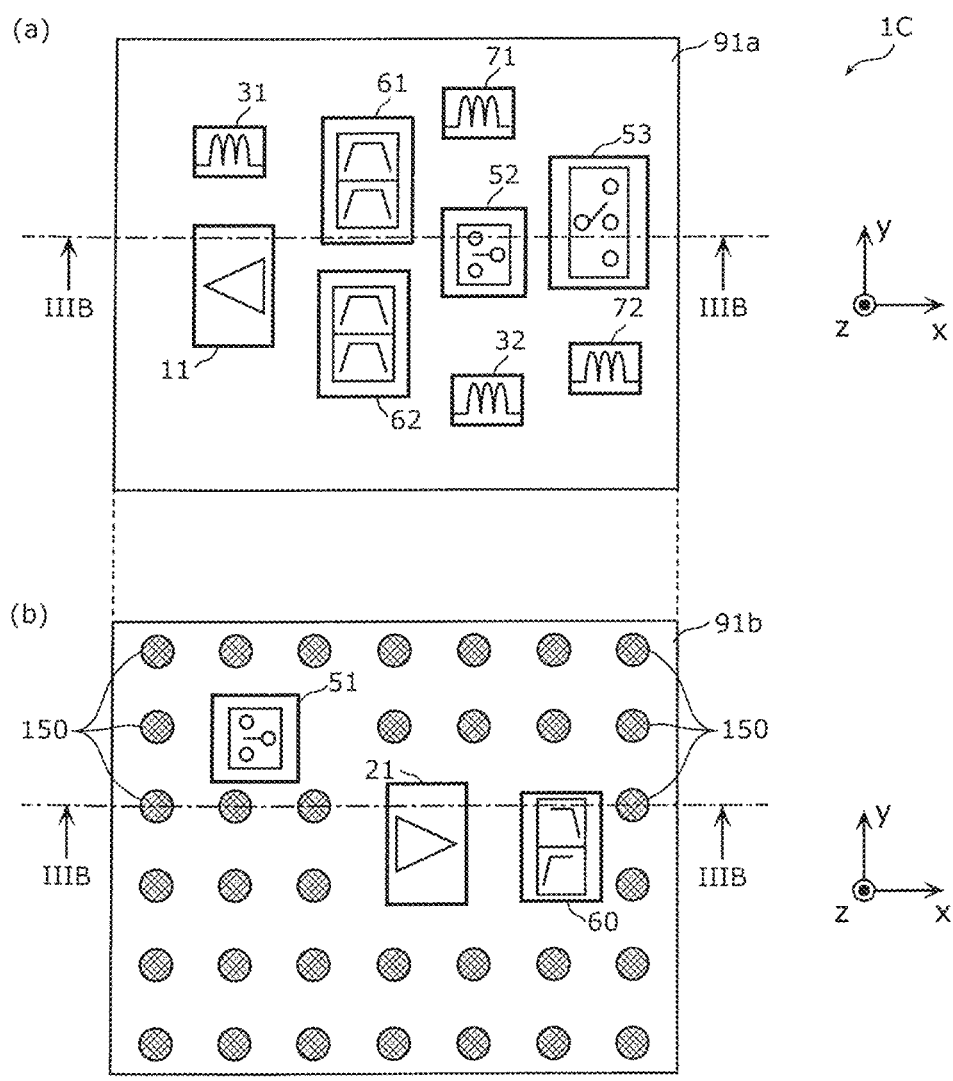
FIG. 3A is a schematic diagram illustrating a plan view configuration of a radio frequency module according to Working Example 2.
Figure 3B:
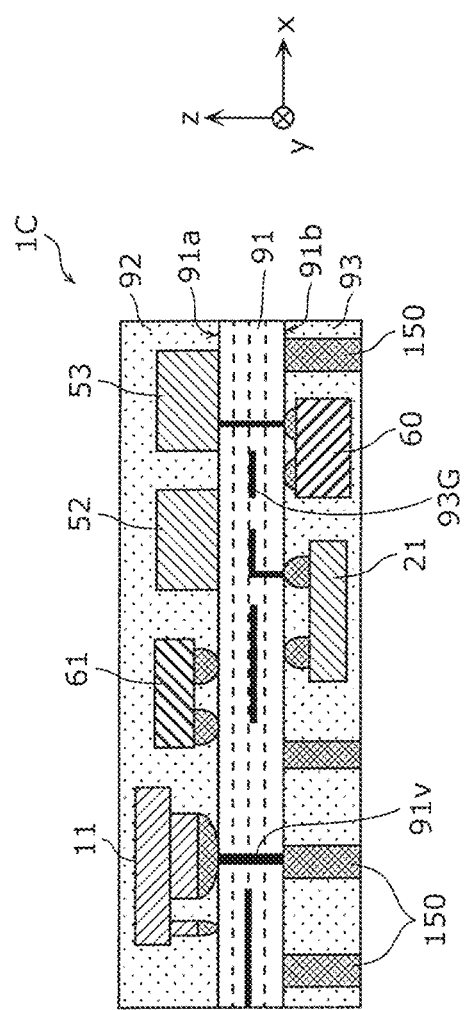
FIG. 3B is a schematic diagram illustrating a cross-sectional configuration of the radio frequency module according to Working Example 2.

FIG. 3A is a schematic diagram illustrating a plan view configuration of radio frequency module 1C according to Working Example 2. FIG. 3B is a schematic diagram illustrating a cross-sectional configuration of radio frequency module 1C according to Working Example 2, and is specifically a cross-sectional view taken at line IIIB-IIIB in FIG. 3A. Note that part (a) of FIG. 3A illustrates how circuit elements are arranged when, of principal surfaces 91a and 91b located on opposite sides of module board 91, principal surface 91b is viewed from the z-axis positive side. Part (b) of FIG. 3A is a perspective view illustrating how circuit elements are arranged when principal surface 91b is viewed from the z-axis positive side.

Radio frequency module 1C according to Working Example 2 is to specifically show an arrangement of circuit elements included in radio frequency module 1 according to the embodiment.

Radio frequency module 1C according to the present working example is different from radio frequency module 1A according to Working Example 1 in arrangement of diplexer 60 and switches 52 and 53. Hereinafter, radio frequency module 1C according to the present working example will be described, focusing on the aspects different from radio frequency module 1A according to Working Example 1 and omitting the description of the aspects identical to radio frequency module 1A.

Module board 91 includes principal surface 91a (the second principal surface) and principal surface 91b (the first principal surface) on opposite sides of module board 91, and is a board on which the above-described transmitter circuits and receiver circuits are mounted. Examples of the board used for module board 91 include an LTCC board having a configuration in which a plurality of dielectric layers are laminated, an HTCC board, a component-embedded board, a board having an RDL, and a printed circuit board.

As illustrated in FIG. 3A and FIG. 3B, in radio frequency module 1C according to the present working example, transmission power amplifier 11, duplexers 61 and 62, matching circuits 31, 32, 71, and 72, and switches 52 and 53 are disposed on principal surface 91a (the second principal surface) of module board 91. Reception low noise amplifier 21, switch 51, and diplexer 60 are disposed on principal surface 91b (the first principal surface) of module board 91. Note that matching circuits 31, 32, 71, and 72 may be embedded in nodule board 91.

In the present working example, filter 60L is mounted on principal surface 91b (the first principal surface). Switch 52 is mounted on principal surface 91a (the second principal surface). That is to say, filter 60L and switch 52 are disposed with module board 91 interposed therebetween. Thus, with the electromagnetic-field shielding function of module board 91, it is possible to reduce electromagnetic coupling between switch 52 connected to the input terminal of reception low noise amplifier 21 and an inductor or capacitor of filter 60L. Accordingly, it is possible to, for example, reduce deterioration of reception sensitivity of a reception path caused by a flow of a harmonic of a high-output transmission signal output from transmission power amplifier 11 or spurious waves of intermodulation distortion between the transmission signal and another radio frequency signal into the reception path via the electromagnetic coupling (that is, without passing through reception filter 61R or 62R). In other words, by reducing the electromagnetic coupling between switch 52 and an inductor or capacitor of filter 60L, it is possible to reduce deterioration of isolation between transmission signals and reception signals.

Note that in the present working example, filter 60L includes at least one of a chip inductor or a chip capacitor, and is surface-mounted on principal surface 91b. The inductor included in filter 60L may be a planar coil pattern formed on principal surface 91b of module board 91. Even in such a case, since filter 60L and switch 52 are disposed with module board 91 interposed therebetween, the electromagnetic coupling between the planar coil pattern of filter 60L and switch 52 is reduced, thus enabling reduction of deterioration of isolation between transmission signals and reception signals.

Note that as illustrated in FIG. 3B, module board 91 desirably includes ground planar electrode 93G between principal surface 91a and principal surface 91b. Here, it is desirable that, in a plan view of module board 91, a footprint of ground planar electrode 93G at least partially overlaps with a footprint of filter 60L (diplexer 60) and at least partially overlaps with a footprint of switch 52.

According to this configuration, with the electromagnetic-field shielding function of ground planar electrode 93G, the isolation between filter 60L and switch 52 is further improved. Therefore, deterioration of isolation between transmission signals and reception signals can be further reduced.

In radio frequency module 1C according to the present working example, a plurality of external-connection terminals 150 are disposed on principal surface 91b (the first principal surface) of module board 91. Radio frequency module 1C transmits and receives, via the plurality of external-connection terminals 150, electric signals to and from the motherboard disposed on the z-axis negative side of radio frequency module 1C. As illustrated in part (b) of FIG. 3A, the plurality of external-connection terminals 150 may be disposed on principal surface 91b to surround reception low noise amplifier 21, switch 51, and diplexer 60 in a plan view of principal surface 91b. Some of external-connection terminals 150 are set to the ground potential of the motherboard.

With the above arrangement of external-connection terminals 150, since a plurality of external-connection terminals 150 used as ground electrodes are disposed around reception low noise amplifier 21 and diplexer 60, it is possible to inhibit exogenous noise from flowing into the receiver circuits. Further, since a plurality of external-connection terminals 150 used as ground electrodes are disposed around switch 51, it is possible to inhibit transmission noise from flowing out of the transmitter circuits.

Note that in radio frequency module 1C according to the present working example, it is sufficient so long as filter 60L and switch 52 are separately disposed on principal surfaces 91a and 91b of module board 91. The other circuit components may be disposed on any of principal surfaces 91a and 91b, or may be embedded in module board 91.

In radio frequency module 1C according to the present working example, transmission power amplifier 11 is mounted on principal surface 91a (the second principal surface).

Among the circuit components included in radio frequency module 1C, transmission power amplifier 11 is a component that generates a large amount of heat. To enhance the heat dissipation of radio frequency module 1C, it is important to dissipate heat generated by transmission power amplifier 11 to the motherboard via a heat dissipation path having low thermal resistance. When transmission power amplifier 11 is mounted on principal surface 91a, transmission power amplifier 11 and external-connection terminal 150 can be connected via penetrating electrode 91v that penetrates through module board 91 between principal surfaces 91a and 91b as illustrated in FIG. 3B. Thus, the heat dissipation path of transmission power amplifier 11 can be other than a heat dissipation path that passes only through, among the lines provided in module board 91, a planar line pattern with high thermal resistance provided along the xy plane direction. Accordingly, it is possible to provide small-sized radio frequency module 1C having enhanced heat dissipation from transmission power amplifier 11 to the motherboard.

Note that from the viewpoint of heat dissipation, external-connection terminal 150 or a heat dissipating component is desirably disposed in a region of principal surface 91b facing the region of principal surface 91a in which transmission power amplifier 11 is disposed. Thus, no circuit elements are desirably disposed in that region of principal surface 91b as illustrated in part (b) of FIG. 3A.

In radio frequency module 1C according to the present working example, external-connection terminals 150 may be disposed on principal surface 91a.

4. Advantageous Effects Etc.

Radio frequency module 1A according to Working Example 1 includes: module board 91 including principal surface 91a and principal surface 91b on opposite sides of module board 91; antenna connection terminal 100; filter 60L that is connected to antenna connection terminal 100, includes one or more inductors and one or more capacitors, and is configured to allow a transmission signal and a reception signal to pass through; and reception low noise amplifier 21 configured to amplify the reception signal. In radio frequency module 1A, filter 60L is on principal surface 91a, and reception low noise amplifier 21 is on principal surface 91b.

According to this configuration, filter 60L and reception low noise amplifier 21 are disposed with module board 91 interposed therebetween. Thus, with the electromagnetic-field shielding function of module board 91, it is possible to reduce electromagnetic coupling between reception low noise amplifier 21 disposed on the reception paths and an inductor or capacitor of filter 60L. Therefore, it is possible to, for example, reduce deterioration of reception sensitivity of a reception path caused by a flow of a harmonic of a high-output transmission signal or spurious waves of intermodulation distortion between the transmission signal and another radio frequency signal into the reception path via the electromagnetic coupling. In other words, by reducing the electromagnetic coupling between reception low noise amplifier 21 and an inductor or capacitor of filter 60L, it is possible to reduce deterioration of isolation between transmission signals and reception signals.

Radio frequency module 1A may further include external-connection terminal 150. External-connection terminal 150 may be on principal surface 91b.

According to this configuration, since a plurality of external-connection terminals 150 used as ground electrodes are disposed around reception low noise amplifier 21, it is possible to inhibit exogenous noise from flowing into the receiver circuits.

Radio frequency module 1A may further include transmission power amplifier 11 configured to amplify a transmission signal, and transmission power amplifier 11 may be on principal surface 91a.

According to this configuration, the heat dissipation path of transmission power amplifier 11 can be other than a heat dissipation path that passes only through, among the lines provided in module board 91, a planar line pattern with high thermal resistance provided along the xy plane direction. Accordingly, it is possible to provide small-sized radio frequency module 1A having enhanced heat dissipation from transmission power amplifier 11 to the motherboard.

Radio frequency module 1A includes: module board 91; filter 60L configured to allow a transmission signal and a reception signal of communication band A and a transmission signal and a reception signal of communication band B to pass through; reception low noise amplifier 21; reception filter 61R that is on reception path AR connecting filter 60L and reception low noise amplifier 21, and is configured to allow the reception signal of communication band A to pass through; reception filter 62R that is on reception path BR connecting filter 60L and reception low noise amplifier 21, and is configured to allow the reception signal of communication band B to pass through; and switch 52 configured to switch connection and disconnection between reception filter 61R and reception low noise amplifier 21, and switch connection and disconnection between reception filter 62R and reception low noise amplifier 21. In radio frequency module 1A, filter 60L is on principal surface 91a, and switch 52 is on principal surface 91b.

According to this configuration, filter 60L and switch 52 are disposed with module board 91 interposed therebetween. Thus, with the electromagnetic-field shielding function of module board 91, it is possible to reduce electromagnetic coupling between switch 52 connected to the input terminal of reception low noise amplifier 21 and an inductor or capacitor of filter 60L. Therefore, it is possible to, for example, reduce deterioration of reception sensitivity of a reception path caused by a flow of a harmonic of a high-output transmission signal or spurious waves of intermodulation distortion between the transmission signal and another radio frequency signal into the reception path via the electromagnetic coupling. In other words, by reducing the electromagnetic coupling between switch 52 and an inductor or capacitor of filter 60L, it is possible to reduce deterioration of isolation between transmission signals and reception signals.

In radio frequency module 1A, reception low noise amplifier 21 may be on principal surface 91b, and switch 52 and reception low noise amplifier 21 may be included in single semiconductor integrated circuit (IC) 20.

According to this configuration, it is possible to reduce the height in the z-axis direction on the principal surface 91b side, and reduce the component mounting area of principal surface 91b. Thus, the size of radio frequency module 1A can be reduced.

Radio frequency module 1C according to Working Example 2 includes module board 91, filter 60L, reception low noise amplifier 21, reception filter 61R, reception filter 62R, and switch 52. Filter 60L is mounted on principal surface 91b, and switch 52 is mounted on principal surface 91a.

According to this configuration, by reducing the electromagnetic coupling between switch 52 and an inductor or capacitor of filter 60L, it is possible to reduce deterioration of isolation between transmission signals and reception signals.

Radio frequency module 1C may further include external-connection terminal 150, and external-connection terminal 150 may be on principal surface 91b.

In radio frequency module 1C, reception low noise amplifier 21 may be on principal surface 91b.

According to this configuration, since a plurality of external-connection terminals 150 used as ground electrodes are disposed around reception low noise amplifier 21, it is possible to inhibit exogenous noise from flowing into the receiver circuits.

Radio frequency module 1C may further include transmission power amplifier 11, and transmission power amplifier 11 may be on principal surface 91a.

According to this configuration, the heat dissipation path of transmission power amplifier 11 can be other than a heat dissipation path that passes only through, among the lines provided in module board 91, a planar line pattern with high thermal resistance provided along the xy plane direction. Accordingly, it is possible to provide small-sized radio frequency module 1C having enhanced heat dissipation from transmission power amplifier 11 to the motherboard.

In radio frequency module 1 according to the present embodiment, filter 60L may include at least one of a chip inductor or a chip capacitor.

In radio frequency module 1, filter 60L may have a frequency range of a first frequency range group as a passband, the first frequency range group including a plurality of communication bands. Radio frequency module 1 may further include filter 60H connected to antenna connection terminal 100 and having a frequency range of a second frequency range group as a passband, the second frequency range group being different from the first frequency range group. Filter 60L and filter 60H may be included in diplexer 60 configured to at least demultiplex a radio frequency signal of the first frequency range group and a radio frequency signal of the second frequency range group.

Communication device 5 includes: radio frequency (RF) signal processing circuit (RFIC) 3 configured to process a radio frequency signal which is to be transmitted by antenna 2 and a radio frequency signal which has been received by antenna 2; and radio frequency module 1 configured to transfer the radio frequency signals between antenna 2 and RFIC 3.

According to this configuration, it is possible to provide communication device 5 in which deterioration of isolation between transmission signals and reception signals is reduced.

Other Embodiments, Etc.

Although a radio frequency module and a communication device according to an embodiment of the present disclosure have been described based on the embodiment, working examples, and variations, the radio frequency module and the communication device according to the present disclosure are not limited to the above embodiment, working examples, and variations. The present disclosure also encompasses other embodiments implemented by arbitrarily combining constituent elements in the above embodiment, working examples, and variations, as well as variations resulting from various modifications to the above embodiment, working examples, and variations that are conceivable to a person skilled in the art without departing from the essence of the present disclosure, and various apparatuses that include the above radio frequency module and communication device.

For example, in the radio frequency module and the communication device according to the above embodiment, working examples, and variations, circuit elements and lines, for instance, may be interposed between circuit elements and paths that connect signal paths illustrated in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to communication apparatuses such as mobile phones, as a radio frequency module disposed in a multiband-compatible front-end unit.

The invention claimed is:
1. A radio frequency module, comprising:
 a module board including a first principal surface and a second principal surface on opposite sides of the module board;
 an antenna connection terminal;
 an inductor-capacitor (LC) filter on the first principal surface and connected to the antenna connection terminal, wherein the LC filter includes one or more inductors and one or more capacitors, and is configured to allow a transmission signal and a reception signal to pass through; and a reception low noise amplifier on the second principal surface and configured to amplify the reception signal.

2. The radio frequency module of claim 1, further comprising:
an external-connection terminal on the second principal surface.

3. The radio frequency module of claim 2, further comprising:
a transmission power amplifier on the first principal surface and configured to amplify a transmission signal.

4. The radio frequency module of claim 1, further comprising:
at least a first ground planar electrode disposed between the first principal surface and the second principal surface.

5. The radio frequency module of claim 4, further comprising:
a switch on the second principal surface and connected to the antenna connection terminal
via the LC filter.

6. The radio frequency module of claim 5, wherein
in a plan view of the module board, a footprint of the ground planar electrode at least partially overlaps a footprint of the LC filter.

7. The radio frequency module of claim 4, further comprising:
a reception low noise amplifier on the second principal surface.

8. The radio frequency module of claim 7, wherein
in a plan view of the module board, a footprint of the ground planar electrode at least partially overlaps a footprint of the reception low noise amplifier.

9. The radio frequency module of claim 1, wherein
the LC filter includes at least one of a chip inductor or a chip capacitor.

10. The radio frequency module of claim 1, wherein
the LC filter has a frequency range of a first frequency range group as a passband, the first frequency range group including a plurality of communication bands.

11. The radio frequency module of claim 10, further comprising:
a first filter connected to the antenna connection terminal and having a frequency range of a second frequency range group as a passband, the second frequency range group being different from the first frequency range group.

12. The radio frequency module of claim 11, wherein
the LC filter and the first filter are included in a multiplexer configured to at least demultiplex a radio frequency signal of the first frequency range group and a radio frequency signal of the second frequency range group.

13. A radio frequency module, comprising:
a module board including a first principal surface and a second principal surface on opposite sides of the module board;
an antenna connection terminal;
an inductor-capacitor (LC) filter on the first principal surface and connected to the antenna connection terminal, wherein the LC filter includes one or more inductors and one or more capacitors, and is configured to allow a transmission signal and a reception signal of a first communication band and a transmission signal and a reception signal of a second communication band to pass through;
a reception low noise amplifier configured to amplify the reception signal of the first communication band and the reception signal of the second communication band;
a first reception filter that is on a reception path connecting the LC filter and the reception low noise amplifier, and is configured to allow the reception signal of the first communication band to pass through;
a second reception filter that is on a reception path connecting the LC filter and the reception low noise amplifier, and is configured to allow the reception signal of the second communication band to pass through; and
a switch disposed on the second principal surface and configured to switch connection and disconnection between the first reception filter and the reception low noise amplifier, and switch connection and disconnection between the second reception filter and the reception low noise amplifier.

14. The radio frequency module of claim 13, further comprising:
an external-connection terminal on the second principal surface.

15. The radio frequency module of claim 14, wherein
the reception low noise amplifier is on the second principal surface.

16. The radio frequency module of claim 15, wherein
the switch and the reception low noise amplifier are included in a single semiconductor integrated circuit (IC).

17. The radio frequency module of claim 13, further comprising:
an external-connection terminal on the first principal surface.

18. The radio frequency module of claim 17, wherein
the reception low noise amplifier is on the first principal surface.

19. The radio frequency module of claim 18, further comprising:
a transmission power amplifier on the second principal surface and configured to amplify transmission signals.

20. A communication device, comprising
a radio frequency (RF) signal processing circuit configured to process a radio frequency signal which is to be transmitted by an antenna and a radio frequency signal which has been received by the antenna; and
a radio frequency module configured to transfer the radio frequency signals between the antenna and the RF signal processing circuit, wherein
the radio frequency module comprises
a module board including a first principal surface and a second principal surface on opposite sides of the module board;
an antenna connection terminal;
an inductor-capacitor (LC) filter on the first principal surface and connected to the antenna connection terminal, wherein the LC filter includes one or more inductors and one or more capacitors, and is configured to allow a transmission signal and a reception signal to pass through; and
a reception low noise amplifier on the second principal surface and configured to amplify the reception signal.

* * * * *